(12) United States Patent
Schoellkopf (10) Patent No.: US 7,638,828 B2
(45) Date of Patent: Dec. 29, 2009

(54) EMBEDDED CAPACITOR

(75) Inventor: Jean-Pierre Schoellkopf, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 353 days.

(21) Appl. No.: 10/542,041

(22) PCT Filed: Jan. 12, 2004

(86) PCT No.: PCT/FR2004/050011

§ 371 (c)(1),
(2), (4) Date: Feb. 28, 2006

(87) PCT Pub. No.: WO2004/066350

PCT Pub. Date: Aug. 5, 2004

(65) Prior Publication Data

US 2006/0232909 A1    Oct. 19, 2006

(30) Foreign Application Priority Data

Jan. 13, 2003   (FR) ................... 03 00307

(51) Int. Cl.
*H01L 27/108* (2006.01)
(52) U.S. Cl. ............... 257/300; 257/301; 257/532; 257/533; 257/595; 257/E27.016; 257/E27.017; 257/E27.019; 257/E27.025; 257/E27.034; 257/E27.048; 438/243; 438/244; 438/245; 438/381; 438/386; 438/387; 438/388

(58) Field of Classification Search ......... 257/296–313, 257/533, 595–602, E27.016, E27.017, E27.035, 257/E27.037, 532; 438/243–246, 381–392
See application file for complete search history.

(56) References Cited

U.S. PATENT DOCUMENTS

| | | | | | |
|---|---|---|---|---|---|
| 4,649,625 | A | * | 3/1987 | Lu | ............... 438/245 |
| 4,792,834 | A | * | 12/1988 | Uchida | ............ 257/304 |
| 5,302,542 | A | * | 4/1994 | Kishi et al. | ....... 438/152 |
| 5,805,497 | A | | 9/1998 | Uchida | |
| 5,843,820 | A | * | 12/1998 | Lu | ............... 438/243 |
| 5,903,036 | A | | 5/1999 | Onozawa | |
| 6,204,527 | B1 | * | 3/2001 | Sudo et al. | ......... 257/301 |
| 6,759,282 | B2 | * | 7/2004 | Campbell et al. | ..... 438/149 |

OTHER PUBLICATIONS

International Search Report from corresponding International Application No. PCT/FR2004/050011, filed Jan. 12, 2004.

* cited by examiner

*Primary Examiner*—Jasmine J Clark
(74) *Attorney, Agent, or Firm*—Lisa K. Jorgenson; James H. Morris; Wolf, Greenfield & Sacks, P.C.

(57) ABSTRACT

The invention concerns a capacitor whereof one first electrode consists of a highly doped active region (D) of a semiconductor component (T) formed on one side of a surface of a semiconductor body, and whereof the second electrode consists of a conductive region (BR) coated with insulation (IL) formed beneath said active region and embedded in the semiconductor body.

26 Claims, 5 Drawing Sheets

EMBEDDED CAPACITOR

BACKGROUND OF THE INVENTION

1. Field of the Invention

The present invention generally relates to the forming of capacitors in integrated circuits, and in particular the forming of capacitors associated with sram cells.

2. Discussion of the Related Art

Figure 1:
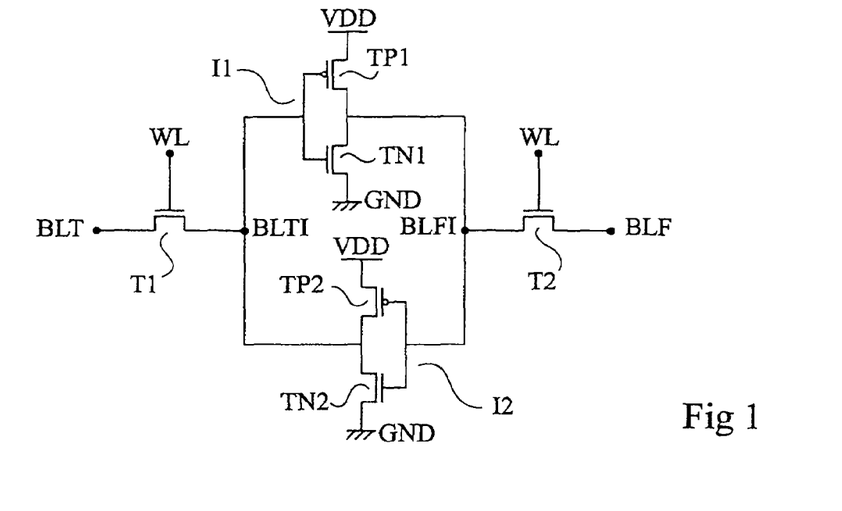
FIGS. 1 and 2, previously described, respectively show a circuit and a simplified top view of a conventional SRAM cell.

FIG. 1 shows an SRAM cell circuit with six transistors. The cell includes a memory point formed of two inverters I1 and I2 connected head-to-tail and having their two inputs, respectively BLTI, BLFI, connected to bit lines BLT, BLF by N-channel MOS transistors (NMOS) T1, T2. The gates of transistors T1 and T2 are connected to a word line WL. Inverter I1 comprises a PMOS transistor TP1 and an NMOS transistor TN1. The gates of transistors TP1 and TN1 are connected to terminal BLTI of the inverter. The drains of transistors TP1 and TN1 are connected and form the output terminal of the inverter. The sources of transistors TP1 and TN1 are respectively connected to a supply voltage VDD and a ground GND. Inverter I2 has the same structure and includes a PMOS transistor TP2 and an NMOS transistor TN2.

Figure 2:
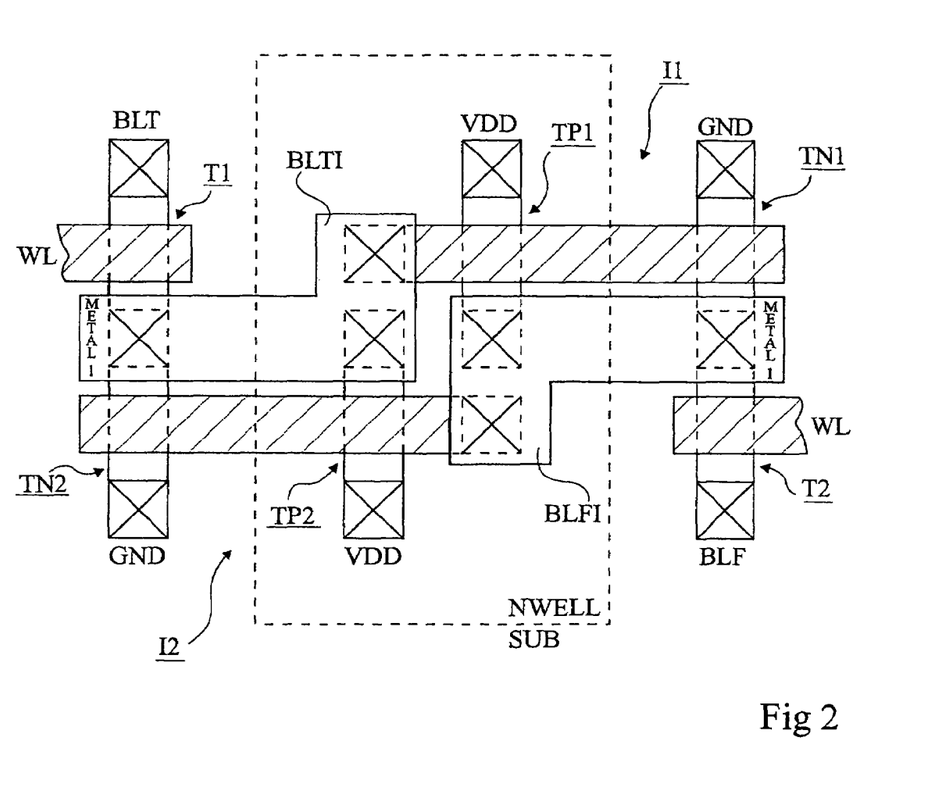

FIG. 2 shows a simplified top view of an embodiment in CMOS technology of the SRAM cell of FIG. 1. For simplicity, the P- and N-channel transistors are shown with the same gate widths. N-channel transistors T1, T2, TN1, and TN2 are formed in a P-type substrate (SUB) and P-channel transistors TP1 and TP2 are formed in an N-type well (NWELL). The drain regions of transistors TN1, T1, and TN2, T2 are confounded. The transistor gates, formed of polysilicon, are shown in hatchings. The gates of transistors TP1, TN1, respectively TP2, TN2, are interconnected. The drains of transistors TP1 and TN1 are connected to the gates of transistors TP2, TN2 by a conductive line formed in an upper metal layer (METAL1) via vias or contacts (the locations of which are shown with crosses). The drains of transistors TP2 and TN2 are connected to the gate of transistors TP1, TN1 by a conductive line formed in the same metal layer (METAL1). Vias form the contact between the source regions of transistors T1, T2, TN1, TN2, TP1, TP2 and metal lines, not shown, respectively connected to lines BLT, BLF and to voltages GND, GND, VDD, and VDD. The N-type well is grounded and the substrate is at a predetermined voltage. For clarity, the STI transistor insulation trenches have not been shown. The STI trenches are preferably the inverse of the active areas (drains or sources).

Inverters I1 and I2 form a bistable structure or memory point that can take two states. When transistors T1 and T2 are on, an appropriate control of bit lines BLT, BLF enables modifying the state of the memory point and thereby programming a piece of information. When transistors T1 and T2 are off, the memory cell keeps the information in the form of a charge on the gate capacitors of the transistors of one or the other of the inverters.

If an ionizing radiation hits cell 2, this creates parasitic electric charges that may change the stored state. Because recent SRAM cells are formed with MOS transistors having smaller and smaller dimensions, the gate capacitance of the transistors forming the inverters is smaller and smaller and the memory point is more and more sensitive to ionizing radiations, all the more as supply voltage VDD of the inverters is smaller and smaller.

To increase the resistance against ionizing radiations of an SRAM cell of small surface area formed with small-size transistors, it has been provided to couple the gates of the memory point transistors with additional capacitors. The problem of forming such capacitors without increasing the SRAM cell surface area then has to be overcome.

SUMMARY OF THE INVENTION

An object of the present invention is to provide a capacitor structure that can be arranged in an integrated circuit without increasing the circuit surface.

Another object of the present invention is to provide such a structure enabling association of capacitors with an SRAM cell without increasing the surface area of said cell.

Another object of the present invention is to provide a method for manufacturing such a capacitor.

An object of the present invention is to provide a method for manufacturing such a capacitor.

To achieve these objects, as well as others, the present invention provides a buried capacitor formed by a conductive region coated with an insulator, formed in an active region of a component of the integrated circuit.

More specifically, the present invention provides a capacitor having a first electrode formed of a heavily-doped active region of a semiconductor component formed on the side of a surface of a semiconductor bulk, and having its second electrode formed of a conductive region coated with an insulator formed under said active region and embedded in the semiconductor bulk.

According to an embodiment of the present invention, the coated conductive region comprises an extension above a portion of which is formed a contact opening towards the second electrode.

According to an embodiment of the present invention, the heavily-doped active region is the drain or source region of a MOS transistor.

The present invention also aims at an SRAM cell comprising two inverters coupled head-to-tail, each of which comprises two MOS transistors of two conductivity types formed side by side, having their drains connected to each other and having their gates connected to each other, and comprising two capacitors such as described previously, the respective first electrodes of which are the drains of said transistors and the second electrodes of which are a same coated region connected to the gates of said transistors via a contact opening formed between the two transistors.

The present invention also aims at a DRAM cell comprising a MOS transistor having its source region connected to a bit line, having its gate connected to a word line, and comprising a capacitor such as described hereabove, the first electrode of which is the drain region of said transistor and the second electrode of which is a coated region connected to a supply line.

The present invention also aims at an integrated circuit in which the insulator coating the lower surface of the coated region exhibits a larger dielectric constant than the insulator coating the rest of the coated conductive region.

The present invention also aims at a method for manufacturing a capacitor having a first electrode formed of a heavily-doped active region of a semiconductor component, comprising the steps of:

a/ forming at the surface of an initial semiconductor substrate a conductive region coated with an insulator;

b/ growing by epitaxy a semiconductor layer to cover the initial substrate and bury the coated region;

c/ forming said heavily-doped active region across the entire thickness of said semiconductor layer, above a portion of the coated conductive region.

According to an embodiment of the present invention, the heavily-doped active region is one of the drain region and of the source region of a MOS transistor.

According to an embodiment of the present invention, before forming the drain and source regions, an opening is made above another portion of the coated conductive region in said semiconductor layer and in the insulator coating the conductive region to connect the conductive region to a conductive layer used to form the gate of the transistor.

According to an embodiment of the present invention, the opening is made at the step of digging the STI insulation trenches of said MOS transistor.

The foregoing objects, features, and advantages of the present invention will be discussed in detail in the following non-limiting description of specific embodiments in connection with the accompanying drawings.

BRIEF DESCRIPTION OF THE DRAWINGS

FIGS. 7A to 10A, 7B to 10B, and 7C to 10C respectively show same top and cross-section views for subsequent steps of the manufacturing of inverter I1;

DETAILED DESCRIPTION

The same reference numerals designate the same elements in FIGS. 1 and 2 and in the next drawings. Only those elements necessary to the understanding of the present invention have been shown.

Figure 3A:
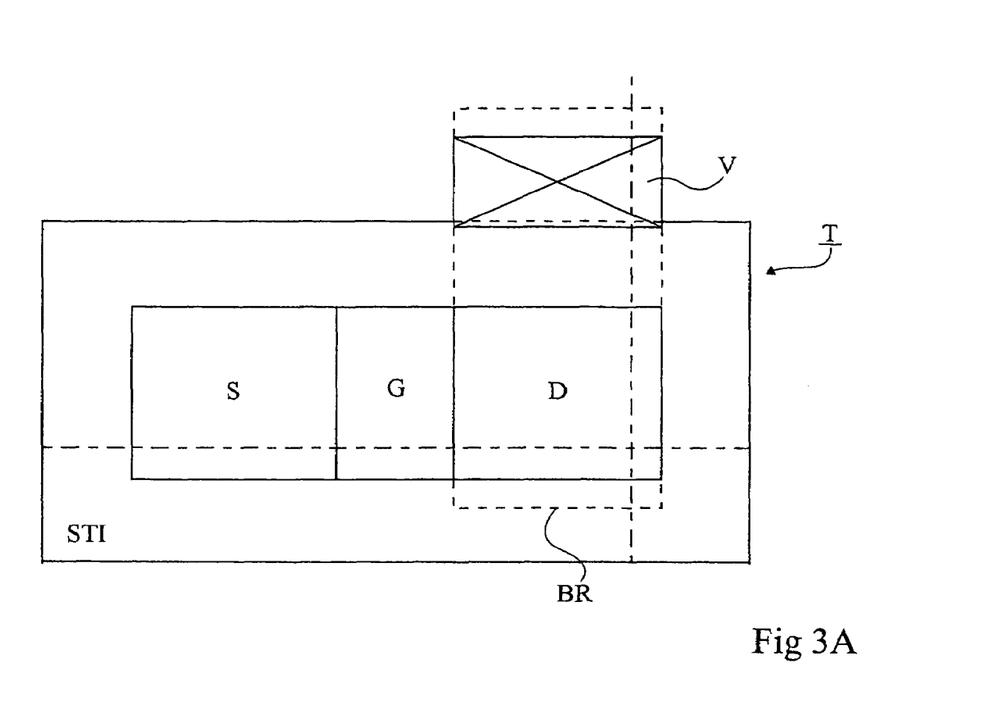
FIGS. 3A and 3B are top and perspective views of a MOS transistor having its drain forming a first electrode of a capacitor according to the present invention.
Figure 3B:
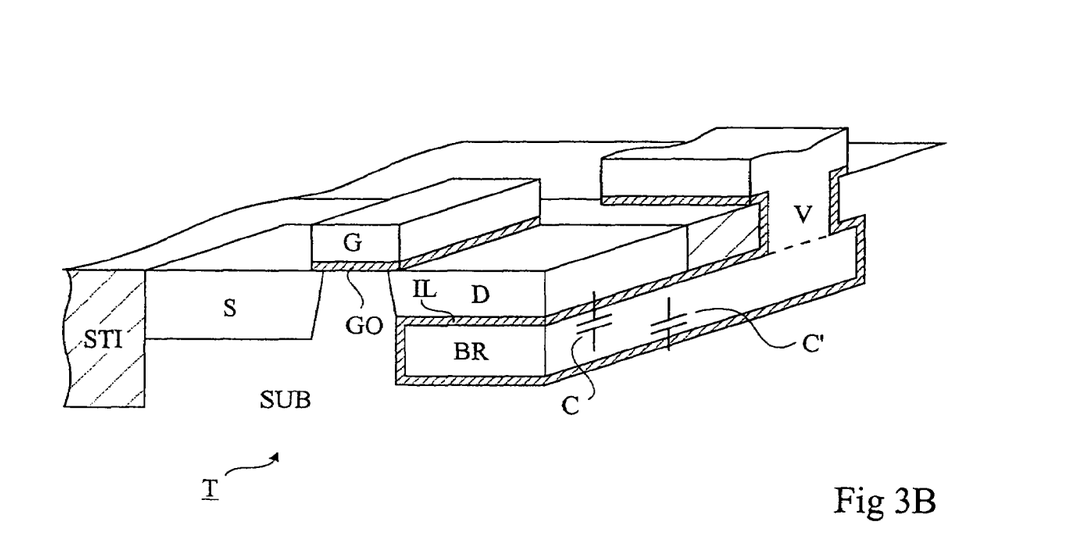

FIG. 3A is a simplified top view of an N-type MOS transistor, T, having its drain forming a first electrode of a capacitor C according to the present invention. FIG. 3B is a perspective view of the transistor and of the capacitor of FIG. 3A. In FIG. 3B, in the cross-section portions, the insulating regions are hatched.

As illustrated in FIGS. 3A and 3B, transistor T comprises a gate G formed of polysilicon on a thin gate oxide layer GO at the surface of a substrate SUB. The transistor comprises a source region S and a drain region D, both heavily doped, formed on either side of gate G in the substrate surface. The transistor is surrounded with an STI shallow insulation trench formed in the substrate surface.

According to the present invention, a conductive region BR coated with an insulator (IL) is formed in drain region D of transistor T so that a portion of region BR is separated from an opposite portion of drain region D by insulator IL surrounding conductive region BR. In FIGS. 3A, 3B and in the next drawings, coated region BR is arranged so that only the lower surface of drain region D rests on the upper surface of a portion of coated region BR. The present invention however also aims at the cases where the drain region partially or completely surrounds the lateral surfaces of a portion of region BR. A first capacitor C is formed between the opposite portions of drain D and of region BR, separated by the insulator coating region BR. A second capacitor C' is formed between the opposite portions of region BR and of substrate SUB, separated by the insulator coating region BR. An opening V with insulator-coated walls is formed above another portion of region BR. A conductive layer, for example, polysilicon, fills opening V to form a contact towards region BR therein.

Thus, according to a first advantage of the present invention, a capacitor having as one electrode a heavily-doped active region of a component (here, the drain of a transistor) is formed, the surface area taken up by the active region and the capacitor altogether being no greater than the surface area of the active region.

According to a second advantage of the present invention which will appear from the following description, the contact with the second capacitor electrode may be formed at the same time as the MOS transistor gates.

According to a third advantage which will also appear from the following description of a manufacturing process, the insulator between the active region and the underlying conductive region may be chosen independently from the insulator between this conductive region and the substrate, whereby capacitors C and C' may be optimized independently.

Figure 4:
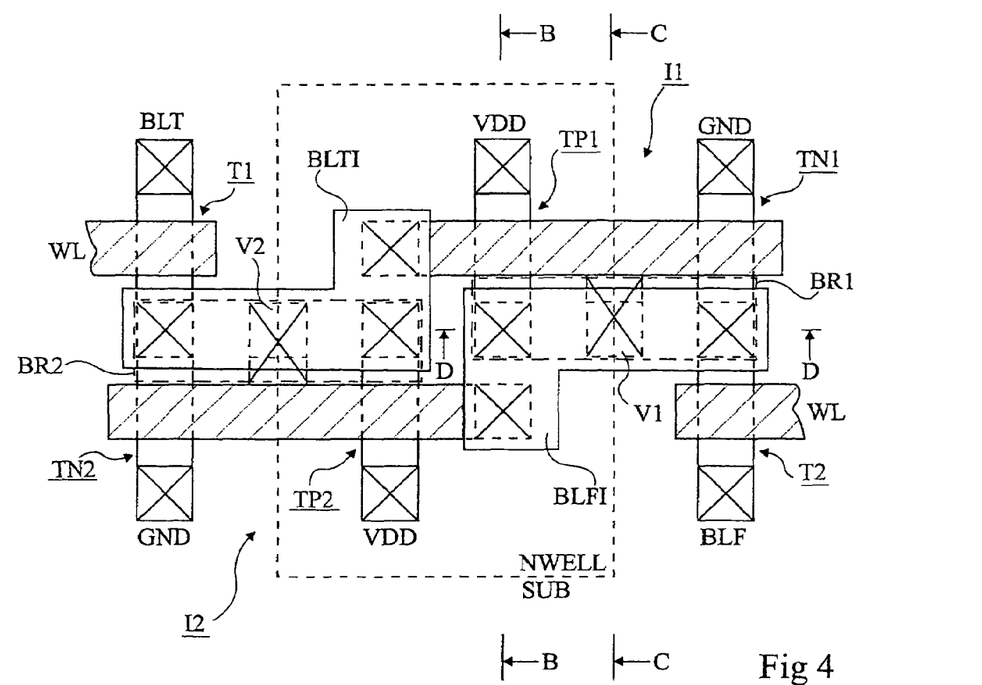
FIG. 4 is a simplified top view of an SRAM cell associated with capacitors according to the present invention.

FIG. 4 shows a simplified top view of an SRAM CMOS cell with six transistors associated with capacitors according to the present invention. The SRAM cell comprises two inverters I1 and I2 and two transistors T1, T2 having the same connections and the same dimensions as in FIG. 2. According to a preferred embodiment of the present invention, a same coated region BR1 is arranged so that the drain regions of transistors TP1 and TN1 of inverter I1 each directly rest on a portion of coated region BR1. Further, a projection of the etched polysilicon region forming the gates of transistors TP1 and TN1 is formed to electrically connect said gates to region BR1 via a contact opening V1. Opening V1 is made between transistors TP1 and TN1 above the border between well NWELL and substrate SUB. As illustrated hereafter in relation with FIG. 5, four capacitors are formed around coated region BR1 connected to the gates of transistors TP1 and TN1 of inverter I1. Similarly, the drain regions of transistors TP2 and TN2 of inverter I2 each directly rest on a coated region BR2 connected by an opening V2 to the gates of transistors TP2 and TN2, and four capacitors are formed around coated region BR2 connected to the gates of transistors TP2 and TN2 of inverter I2. The eight capacitors connected to the gates of the transistors of inverters I1 and I2 increases the resistance of the SRAM cell against ionizing radiations.

This preferred embodiment of the present invention takes advantage of the fact that a conventional CMOS manufacturing process requires that a P-channel transistor formed in an N-type well, here, transistor TP1 of inverter I1, is separated by a minimum predetermined distance from the closest N-channel transistor formed in the substrate, here, transistor TN1 of inverter I1. The minimum predetermined distance depends on the process used but, advantageously, in a standard CMOS process conventionally used to form an SRAM cell, the distance separating transistors TP1 and TN1 is sufficient for the accuracy of the process to enable forming opening V1 and the gate layer excrescence without having to move further apart transistors TP1 and TN1. Thus, the surface area of inverter I1 coupled to capacitors according to the present invention is identical to the surface of a conventional inverter. The same occurs for inverter I2, whereby the present invention enables forming an SRAM cell resistant against ionizing radiations which takes up the same surface area as a conventional SRAM cell non resistant against radiations.

Figure 5:
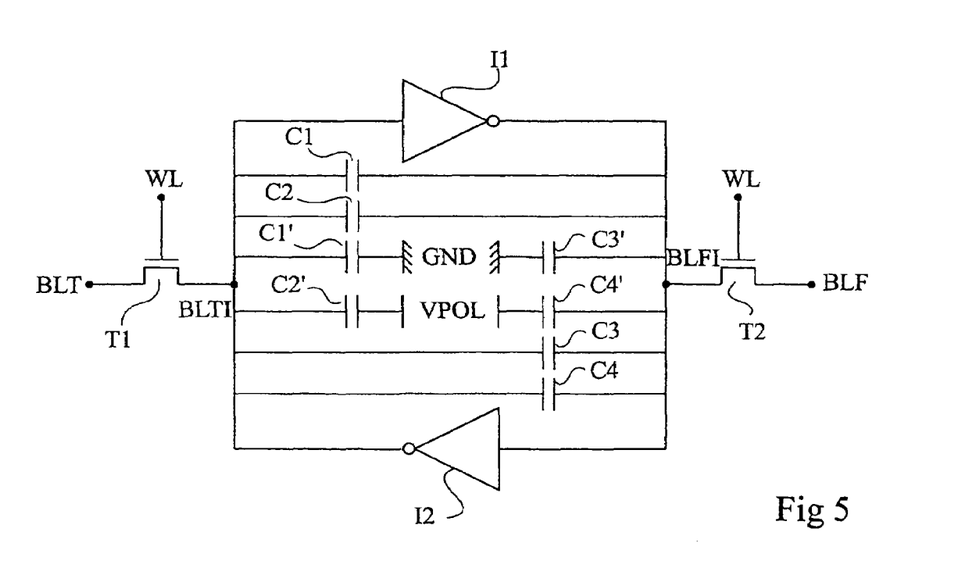
FIG. 5 shows a circuit equivalent to the structure of FIG. 4.

FIG. 5 shows a circuit equivalent to the structure of FIG. 4 and indicates, in particular, the connections of the capacitors according to the present invention. Inverters I1 and I2 are shown in the form of blocks. A capacitor C1, formed between drain D of transistor TP1 and region BR1 connected to the gate of transistor TP1, couples the input and the output of inverter I1. Similarly, a capacitor C2 formed between the drain of transistor TN1 and region BR1 couples the input and the output of inverter I1. A capacitor C1', formed between conductive region BR1 and well NWELL, couples the input of inverter I1 to ground GND. A capacitor C2', formed between region BR1 and the substrate, couples the input of inverter I1 to a bias voltage VPOL of substrate SUB. Similarly, capacitors C3, C4, respectively formed between the drains of transistors TP2, TN2, and region BR2, couple the input and the output of inverter I2. A capacitor C3' according to the present invention, formed between conductive region BR2 and well NWELL, couples the input of inverter I2 to ground GND. A capacitor C4' according to the present invention, formed between region BR2 and the substrate, couples the input of inverter I2 to voltage VPOL.

FIGS. 6 to 10 hereafter illustrate manufacturing steps of capacitors according to an embodiment of the present invention. As an example, FIGS. 6 to 10 hereafter illustrate manufacturing steps of the capacitors associated with inverter I1 of the SRAM cell of FIG. 4.

Figure 6A:
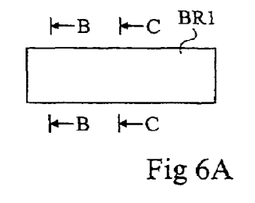
FIGS. 6A, 6B, 6C illustrate a step of the manufacturing of inverter I1 of the SRAM cell of FIG. 4 respectively in a top view and in cross-section views taken in planes B-B, C-C.
Figure 6B:
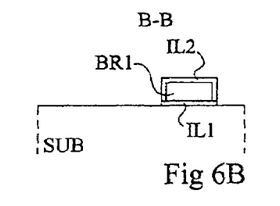
Figure 6C:
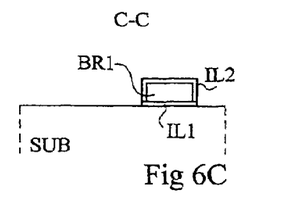

FIGS. 6A, 6B, and 6C respectively show a top view and cross-section views along planes B-B, C-C of inverter I1 after the first steps of a manufacturing process according to the present invention. Plane B-B cuts transistor TP1 lengthwise. The source and drain of transistor TP1 are respectively to the left and to the right of the cross-section view along plane B-B.

In first steps, a thin insulating layer IL1 is deposited at the surface of an initial lightly-doped P-type single-crystal silicon substrate SUB. A layer of a conductor such as polysilicon is deposited above layer IL1, and the two deposited layers are etched by means of a first mask to define region BR1, here according to a rectangle having a first end (B-B cross-section) located under the drain of transistor TP1, and having its other end located under the drain of transistor TN1. A step of thermal oxidation followed by an isotropic etching of the oxide are then performed so that there remains a thin silicon oxide layer IL2 at the surface and on the sides of the polysilicon region and that the silicon oxide is removed at the surface of substrate SUB.

Figure 7A:
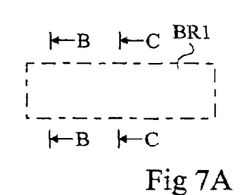
Figure 7B:
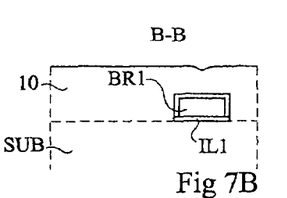
Figure 7C:
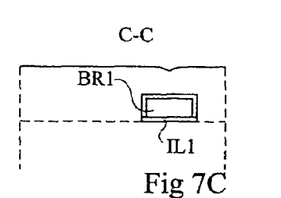

FIGS. 7A, 7B, and 7C respectively show the same views as FIGS. 6A, 6B, and 6C at a subsequent step, after having grown by epitaxy a single-crystal silicon layer 10 from the initial substrate, to cover the initial substrate and completely bury region BR1 by lateral growth. The doping type and level of epitaxial layer 10 are chosen to optimize the MOS transistors to be formed and are not necessarily identical to those of the initial substrate. The initial substrate and epitaxial layer 10 altogether then form a semiconductor substrate or bulk in which is embedded insulator-coated conductive region BR1.

Figure 8A:
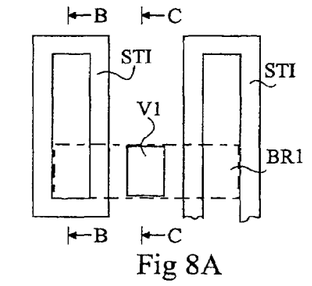
Figure 8B:
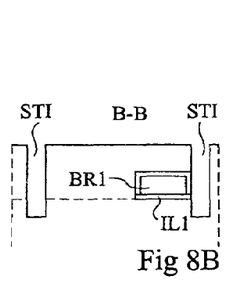
Figure 8C:
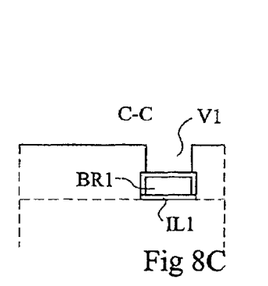

FIGS. 8A, 8B, and 8C respectively show the same views as FIGS. 7A, 7B, and 7C after having:

planarized the surface of single-crystal silicon 10;
formed wells NWELL (not shown); and
formed in layer 10 and the substrate shallow trenches (STI) intended to be filled with an insulator to laterally insulate the MOS transistors from the inverter.

To simplify the drawings, the insulation trenches are in the present drawings shown to be narrower than they really are in practice. According to the present invention, the mask conventionally used to dig the insulation trenches is also used to dig an opening V1 substantially located at the center of region BR1 (C-C cross-section). Due to the etch selectivity between silicon oxide and silicon, above region BR1, the etching naturally stops on the oxide coating region BR1.

Figure 9A:
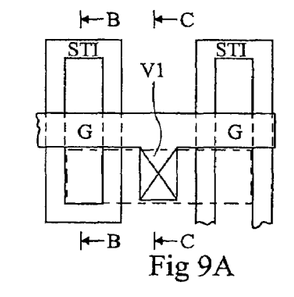
Figure 9B:
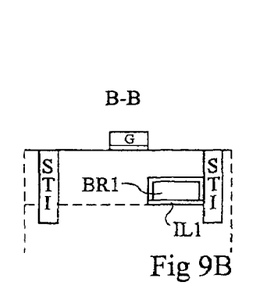
Figure 9C:
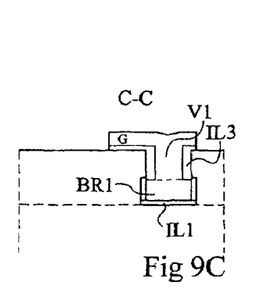

FIGS. 9A, 9B, and 9C respectively show the same views as FIGS. 8A, 8B, and 8C after having:

filled the STI trenches and opening V1 with an insulator such as silicon oxide;
covered with a gate oxide layer the single-crystal silicon of the circuit surface;
removed the insulator present at the center of opening V1 on the upper surface of conductive region BR1, while leaving in place an insulator IL3 on the vertical walls of opening V1;
deposited at the circuit surface a polysilicon layer to form the gate layer of the transistors and fill opening V1 to form an electric contact with buried region BR1; and
etched the polysilicon, then the gate oxide, to define gates G of MOS transistors TN1, TP1 of the inverter, connected together. According to the present invention, the gates of transistors TN1, TP1 are also connected to region BR1 by opening V1.

Figure 10A:
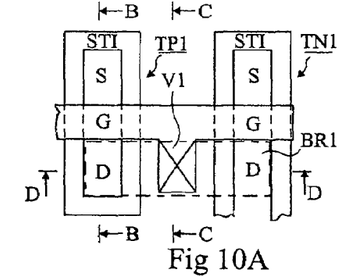
Figure 10B:
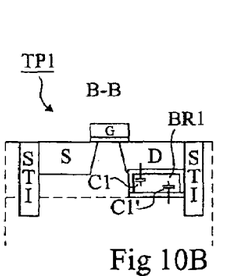
Figure 10C:
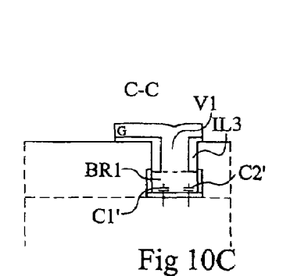

FIGS. 10A, 10B, and 10C respectively show the same views as FIGS. 9A, 9B, and 9C after forming of drain and source regions D and S of PMOS transistor TP1 and NMOS transistor TN1. According to the present invention, the doping of drain regions D of the transistors is such that the drain regions extend in depth to reach insulator IL1 covering the upper surface of conductive region BR1. Various conventional alternative embodiments of drain and source regions may be used, for example, to form structures with LDD-type spacers.

Figure 10D:
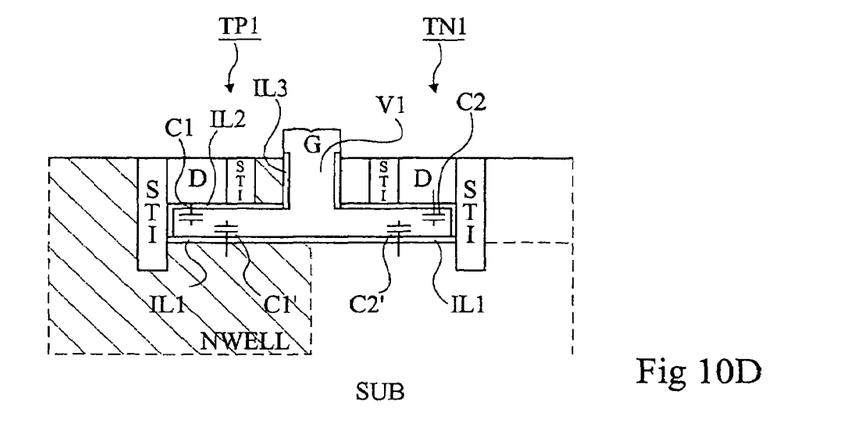
FIG. 10D shows a cross-section view of inverter I1 along a plane D-D at the step illustrated in FIGS. 10A to 10C.

FIG. 10D shows a cross-section view of inverter I1 of FIGS. 10A to 10C along a plane D-D crossing buried conductive layer BR1 across its entire length and crossing the drain regions of transistors TP1, TN1. FIG. 10D further shows well NWELL not shown in FIGS. 6 to 9 for clarity.

The manufacturing process illustrated in FIGS. 6 to 10 is particularly simple to implement. Further, this method requires two specific masks only (described in relation with FIGS. 6 and 9), which makes it particularly inexpensive.

Of course, the present invention is likely to have various alterations, modifications, and improvements which will readily occur to those skilled in the art. In particular, the type and thickness of the thin insulator (IL1) arranged between the lower surface of the conductive regions and the initial substrate may be chosen adequately to optimize the value of the capacitors coupling coated conductive regions BR with well NWELL and with the substrate. As an example, the insulator may be an oxynitride having a thickness from 1 to 2 nm, $AL_2O_3$ having a thickness from 1 to 3 nm, or $Ta_2O_5$ having a thickness from 2 to 3 nm.

The present invention has been described in relation with a specific method for manufacturing a specific structure comprising buried coated conductive regions, but it will be within the abilities of those skilled in the art to adapt the present invention to manufacturing processes enabling forming a structure comprising equivalent buried coated conductive regions.

The present invention has been described in relation with a capacitor formed with a buried insulator-coated conductive region coupling the drain and the gate of a transistor, but it will readily adapt to a capacitor coupling the drain or the source of a MOS transistor to another element of the integrated circuit connected to the buried region.

Figure 11:
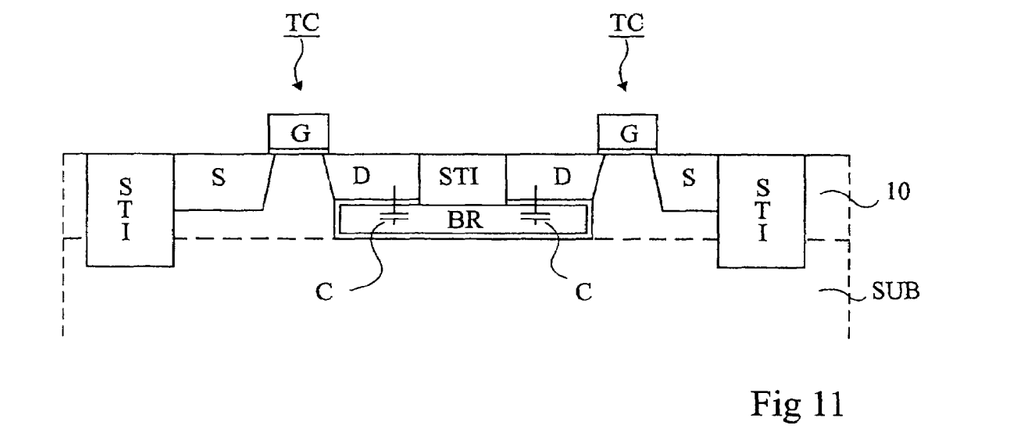
FIG. 11 shows a cross-section view of two DRAM cells according to the present invention.

FIG. 11 shows as an example a cross-section view of two DRAM cells according to the present invention. Each DRAM cell comprises a control transistor TC laterally surrounded with STI trenches, having its source S connected to a bit line not shown, having its gate G connected to a word line not shown, and having its drain D directly resting on a coated conductive region BR. The coated conductive region is connected to a supply line not shown. Capacitor C formed between the opposite surfaces of drain D and of region BR forms the memory point of the DRAM cell. It should be noted by those skilled in the art that the putting in common of coated region BR between the two DRAM cells provides a gain in surface area.

The present invention will also be easily adapted to one or several capacitors coupling other active regions belonging to other types of components of an integrated circuit directly resting on the coated region. The present invention will be especially easily adapted to capacitors coupling several active regions of several components, each of which directly rests on a portion of the same buried region. The present invention will also easily adapt to a bipolar technology.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit comprising a capacitor having first and second electrodes, the first electrode being formed of a drain or source region of a MOS transistor formed on a side of a surface of a semiconductor bulk, the second electrode being formed of a conductive region coated with a dielectric insulator coating disposed under said drain or source region, in the semiconductor bulk, wherein a first insulator coating a lower surface of the coated conductive region exhibits a larger dielectric constant than a second insulator coating the rest of the coated conductive region.

2. The capacitor of claim 1, wherein the coated conductive region comprises an extension above a portion of which is formed a contact opening towards the second electrode.

3. An SRAM cell comprising two inverters head-to-tail, each of which comprises two MOS transistors of two conductivity types formed side by side, having their drains connected to each other and having their gates connected to each other, and comprising two capacitors of claim 1, the respective first electrodes of which are the drains of said transistors and the second electrodes of which we a same coated region connected to the gates of said transistors via a contact opening formed between the two transistors.

4. A DRAM cell comprising a MOS transistor having its source region connected to a bit line, having its gate connected to a word line, and comprising a capacitor-of claim 1, the first electrode of which is the drain region of said transistor and the second electrode of which is a coated region connected to a supply line.

5. A method for manufacturing a capacitor having a first electrode formed of a heavily-doped active region of a semiconductor component, comprising:
 a/ forming at the surface of an initial semiconductor substrate a conductive region coated with an insulator;
 b/ growing by epitaxy a semiconductor layer to cover the initial substrate and bury the coated region;
 c/ forming said heavily-doped active region across the entire thickness of said semiconductor layer, above a portion of the coated conductive region, the heavily-doped active region being insulated from the conductive region.

6. The method of claim 5, wherein the heavily-doped active region is one of the drain region and of the source region of a MOS transistor.

7. The method of claim 6, wherein, before forming the drain and source regions, an opening is made above another portion of the coated conductive region in said semiconductor layer and in the insulator coating the conductive region to connect the conductive region to a conductive layer used to form the gate of the transistor.

8. The method of claim 7, wherein the opening is made at the step of digging the STI insulation trenches of said MOS transistor.

9. At least one capacitor formed on an integrated circuit substrate, the at least one capacitor comprising:
 a first electrode comprising a drain or source of a MOS transistor;
 a first capacitor dielectric region having at least a portion that contacts the first electrode and is buried beneath the first electrode; and
 a second electrode buried beneath the first electrode, the second electrode being insulated from the first electrode and separated from the first electrode by the first capacitor dielectric region.

10. The at least one capacitor of claim 9, wherein the second electrode is electrically connected to a gate of the MOS transistor.

11. The at least one capacitor of claim 9, further comprising:
 a third electrode comprising the substrate;
 a second capacitor dielectric region buried beneath the second electrode that insulates the second electrode from the third electrode.

12. The at least one capacitor of claim 11, wherein a capacitance between the first and second electrodes is different than a capacitance between the second and third electrodes.

13. The at least one capacitor of claim 12, wherein the second capacitor dielectric has a higher dielectric constant than the first capacitor dielectric.

14. The at least one capacitor of claim 9, wherein the second electrode comprises polysilicon.

15. An SRAM cell comprising:
 the at least one capacitor of claim 9; and
 an inverter comprising:
  the MOS transistor comprising a first drain and a first gate, wherein the MOS transistor is a first MOS transistor; and
  a second MOS transistor comprising a second drain and a second gate;
  wherein the first drain and the second drain are coupled to one another;
  wherein the first gate and the second gate are coupled to one another;
 wherein the first electrode comprises the first drain and the second drain, wherein the second electrode is buried beneath the first drain and the second drain, and wherein the first and second gates are coupled to the second electrode.

16. A DRAM cell comprising:
 the at least one capacitor of claim 9, wherein the MOS transistor has a source region that is coupled to a bit line;
 wherein the MOS transistor has a gate that is coupled to a word line;

wherein the first electrode is a drain region of the MOS transistor; and wherein the second electrode is coupled to a supply line.

17. A method of forming a buried capacitor comprising first and second electrodes, the method comprising:
   (A) forming a conductive region above a substrate, the first electrode comprising the conductive region;
   (B) forming an insulating region such that at least a first portion of the insulating region is above the conductive region;
   (C) forming a semiconductor region at least partially above the at least a first portion of the insulating region; and
   (D) forming a heavily-doped active region in the semiconductor region above the at least a first portion of the insulating region such that the heavily-doped active region contacts the at least a first portion of the insulating region, wherein the second electrode comprises the heavily-doped region, wherein the first and second electrodes are insulated from one another.

18. The method of claim 17, wherein forming the conductive region comprises forming a highly-doped polysilicon region.

19. The method of claim 17, wherein (B) comprises forming a second portion of the insulating region below the conductive region to insulate the conductive region from the substrate.

20. The method of claim 17, wherein (B) comprises oxidizing the conductive region to form the insulating region.

21. The method of claim 17, further comprising:
   (E) forming a via through the semiconductor region to the at least a first portion of the insulating region;
   (F) forming, through the via, an opening in the at least a portion of the insulating region to the conductive region; and
   (G) forming, in the via, a conductive region that contacts the conductive region.

22. The method of claim 21, wherein (G) is performed concurrently to forming a gate region of a transistor, wherein the highly-doped active region comprises a portion of the transistor.

23. The method of claim 21, wherein (G) is performed prior to (D).

24. The method of claim 17, wherein the highly-doped active region is formed as a first drain and/or source region of a first MOS transistor.

25. The method of claim 24, further comprising:
   (H) forming a second MOS transistor comprising a second drain and/or source region;
   wherein the first drain and/or source region and the second drain and/or source region are formed such that the via is positioned between the first drain and/or source region and the second drain and/or source region;
   wherein both the first drain and/or source region and the second drain and/or source region are formed above respective portions of the conductive region.

26. The method of claim 25, wherein (H) comprises forming an inverter of an SRAM memory cell.

* * * * *

UNITED STATES PATENT AND TRADEMARK OFFICE
CERTIFICATE OF CORRECTION

PATENT NO. : 7,638,828 B2 Page 1 of 1
APPLICATION NO. : 10/542041
DATED : December 29, 2009
INVENTOR(S) : Jean-Pierre Schoellkopf It is certified that error appears in the above-identified patent and that said Letters Patent is hereby corrected as shown below:

Col. 1, line 8, should read:
of capacitors associated with SRAM cells.

Column 7, claim 3, line 50, should read:
and the second electrodes of which are a same coated region Signed and Sealed this Ninth Day of February, 2010

David J. Kappos
*Director of the United States Patent and Trademark Office*

UNITED STATES PATENT AND TRADEMARK OFFICE
CERTIFICATE OF CORRECTION

PATENT NO.       : 7,638,828 B2                                    Page 1 of 1
APPLICATION NO.  : 10/542041
DATED            : December 29, 2009
INVENTOR(S)      : Jean-Pierre Schoellkopf It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 354 days.

Signed and Sealed this

Ninth Day of November, 2010

David J. Kappos
*Director of the United States Patent and Trademark Office*